United States Patent
Richardson

(10) Patent No.: US 6,784,745 B2
(45) Date of Patent: Aug. 31, 2004

(54) ADJUSTABLE CURRENT-MODE EQUALIZER

(75) Inventor: Kenneth G. Richardson, Erie, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/357,030

(22) Filed: Jan. 31, 2003

(65) Prior Publication Data

US 2004/0150478 A1 Aug. 5, 2004

(51) Int. Cl.[7] .................................................. H03F 3/04
(52) U.S. Cl. ........................ 330/288; 330/304; 323/315
(58) Field of Search ............................... 330/288, 304, 330/294, 277, 296; 323/315, 316

(56) References Cited

U.S. PATENT DOCUMENTS

| | | | | |
|---|---|---|---|---|
| 4,251,778 A | * | 2/1981 | Ahmed | 330/279 |
| 5,373,253 A | * | 12/1994 | Bailey et al. | 330/288 |
| 5,410,275 A | * | 4/1995 | Black | 330/288 |
| 6,323,723 B1 | * | 11/2001 | Gul et al. | 327/538 |

* cited by examiner

*Primary Examiner*—Henry Choe
(74) *Attorney, Agent, or Firm*—Cochran, Freund & Young

(57) ABSTRACT

A current amplifier has a variable resistor or capacitor to provide a high frequency boost. Additionally, additional transistors may be switched in and out of the circuit to provide different gains at lower frequency. The combination of variable resistors or capacitors and the switchable transistors provides control over the low frequency gain of the amplifier and the transition region from low gain to higher gain.

6 Claims, 6 Drawing Sheets

200
GAIN VS FREQUENCY
WITH VARIABLE
CAPACITANCE

ADJUSTABLE CURRENT-MODE EQUALIZER

CROSS REFERENCE TO RELATED APPLICATIONS

This application is filed simultaneously with commonly assigned United States Patent Application entitled "Differential Mode Current Amplifier with High Frequency Boost and Common Mode Rejection" by the present inventor, application Ser. No. 10/357,166, which is hereby specifically incorporated by reference for all it discloses and teaches.

BACKGROUND OF THE INVENTION a. Field of the Invention

The present invention pertains to electronic amplifier circuits and specifically to integrated circuit amplifier circuits.

b. Description of the Background

Amplifier circuits are used in may applications in integrated circuits. One common amplifier circuit is a cascode current mirror that is commonly used in integrated circuits. In general, the current mirrors are designed to generate a flat output. That is, the gain is constant throughout the frequency operating range.

In some applications, there is need to increase or decrease the output of an amplifier in selective portions of the frequency range. For example, if an amplifier receives a signal from a device that has a gain that changes with frequency, the signal would need to be amplified so that the resultant gain was constant over the frequency range.

It would therefore be advantageous to provide an amplifier circuit wherein a current signal may be amplified by different gains over different frequency ranges.

SUMMARY OF THE INVENTION

The present invention overcomes the disadvantages and limitations of the prior art by providing a system and method for amplifying a current signal on an integrated circuit wherein a variable resistor is placed between the input line and the gate of a first transistor of a cascode amplifier and a variable capacitance may further be introduced to change the gain of the signal at different frequencies. Additionally, several transistors may be switched in or out of the circuitry to adjust the gain in the lower regions of input frequencies. The variable resistance, variable capacitance, and switchable transistors can be used to adjust the gain of the amplifier over different frequencies.

The present invention may therefore comprise an equalizing current amplifier comprising: an input line; an output line; a first set of input transistors connected in parallel having the drains connected to the input line and the sources connected to ground, the first set of input transistors comprising at least one transistor; a variable resistor connected to the input line and the gates of the first set of input transistors; and a first set of output transistors connected in parallel having the gates connected to the input line, the sources connected to ground, and the drains connected to the output line, the first set of output transistors comprising at least one transistor.

The present invention may further comprise an equalizing current amplifier comprising: an input line; an output line; a first set of input transistors connected in parallel having the drains connected to the input line, the gates connected to the input line, and the sources connected to ground, the first set of input transistors comprising at least one transistor, a variable capacitor connected to the gates of the first set of input transistors and ground; and a first set of output transistors connected in parallel having the gates connected to the input line, the sources connected to ground, and the drains connected to the output line, the first set of output transistors comprising at least one transistor.

The present invention may further comprise an equalizing current amplifier comprising: an input line; an output line; a first set of input transistors connected in parallel having the drains connected to the input line and the sources connected to ground, the first set of input transistors comprising at least one transistor; a resistor connected to the input line and the gates of the first set of input transistors; a second set of input transistors connected in parallel having the drains connected to the input line, the gates connected to the gates of the first set of input transistors, and the sources connected to a switch, the switch being connected to ground, the second set of input transistors comprising at least one transistor; and a first set of output transistors connected in parallel having the gates connected to the input line, the sources connected to ground, and the drains connected to the output line, the first set of output transistors comprising at least one transistor.

The advantages of the present invention are that current signals may be amplified with a tunable boost across a specific frequency range. The circuitry required is simple and therefore takes up a small portion of space on an integrated circuit. The signal boost may be tuned to a specific frequency range depending on the resistor value or capacitance value chosen. Further, the gain at lower frequencies may be adjusted by switching additional transistors in and out of the circuit.

DETAILED DESCRIPTION OF THE INVENTION

Figure 1:
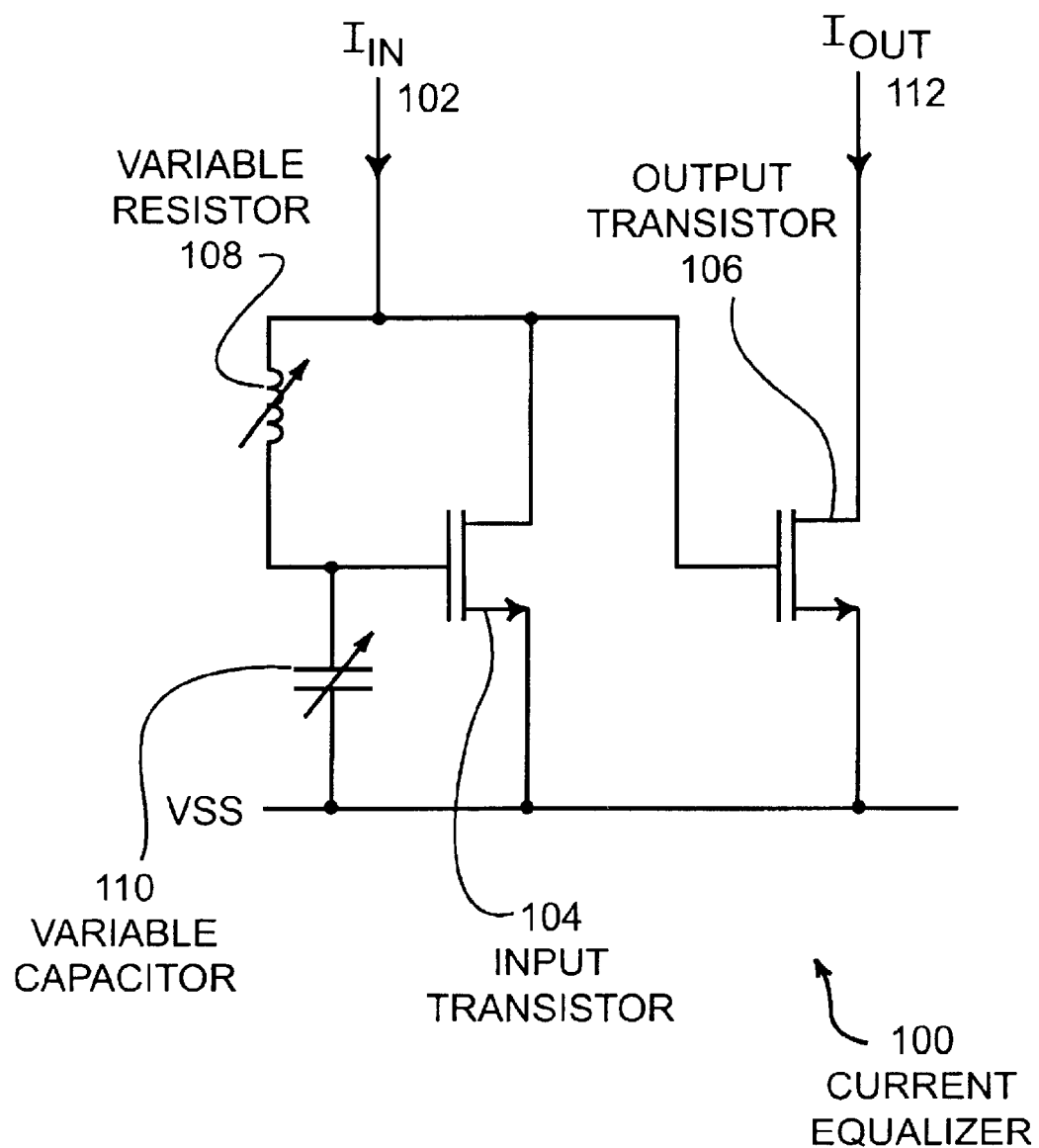
FIG. 1 is an illustration of a first embodiment of a current equalizer wherein a variable resistor or variable capacitor is used to affect the gain.

FIG. 1 illustrates a first embodiment of a current equalizer 100 wherein an input line 102 is connected to the drain of input transistor 104, the gate of output transistor 106, and variable resistor 108. The variable resistor 108 is connected to the gate of transistor 104, which is connected to a variable capacitor 110 that is connected to ground. The sources of transistors 104 and 106 are connected to ground.

If the variable resistor 108 has no resistance, and the variable capacitor 110 is removed, the equalizer 100 functions as a common current mirror. When the resistance 108 or the capacitance 110 is added, the current draw of the input transistor 104 is reduced at high frequencies due to the coupling of the resistance, the capacitance, and the gate capacitance, causing more current to flow to the output transistor 106, and thereby creating higher gain.

By varying the resistance of the resistor 108 or the capacitance of the capacitor 110, the output gain at high frequencies can be changed. The gain can thereby be tailored for the particular application.

In some embodiments, the resistance and capacitance may be switched in and out in discrete intervals. For example, a series of resistors may be each connected to individual transistors capable of switching the resistance value into the circuit. Those skilled in the arts may use different mechanisms to accomplish a variable resistor and a variable capacitor while keeping within the spirit and intent of the present invention.

Transistors as represented in a schematic of an integrated circuit may often be implemented as several small transistors operating in parallel. By varying the number of identical transistors in the first stage and second stage of the amplifier circuit, the output may be amplified or attenuated by the ratio of the number of transistors in each stage.

Figure 2:
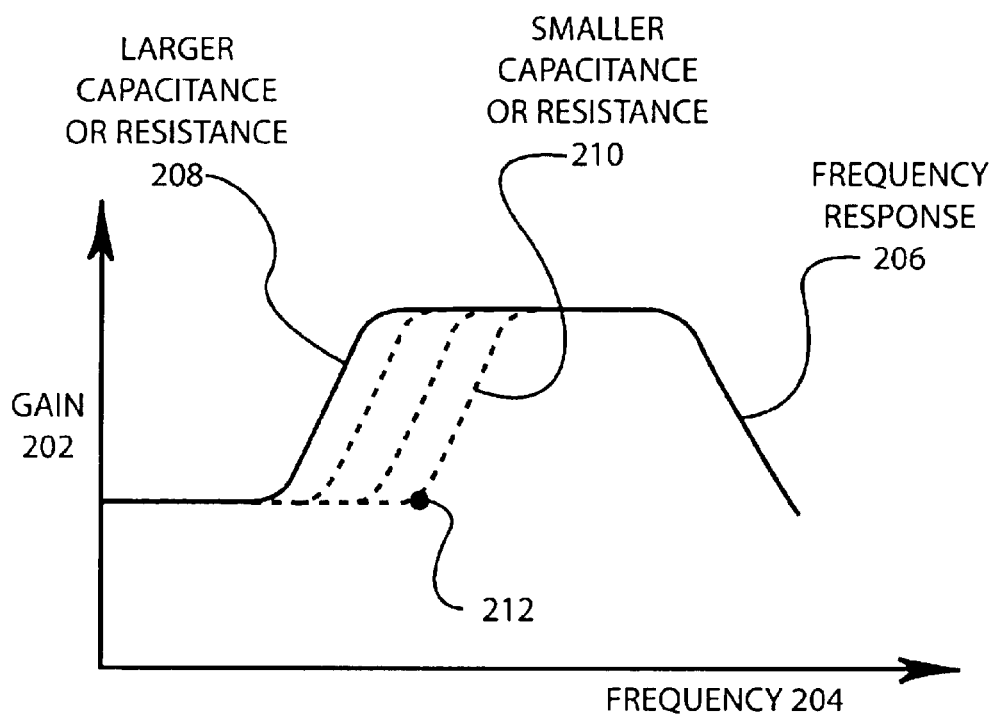
FIG. 2 is an illustration of a plot of gain verses frequency for the embodiment illustrated in FIG. 1.
Figure 2:
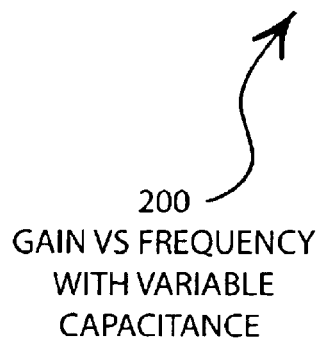

FIG. 2 illustrates a plot 200 of gain 202 verses frequency 204 for the embodiment 100. The curve 206 represents the gain with respect to frequency. The curve 208 illustrates the shape of the curve when a larger resistance or capacitance is present, while curve 210 illustrates the shape of the curve when a smaller resistance or capacitance is present. Either or both of the resistance or capacitance can be varied to achieve this effect. In some cases, it may be more economical to only vary either the resistance or capacitance to achieve the same result.

Figure 3:
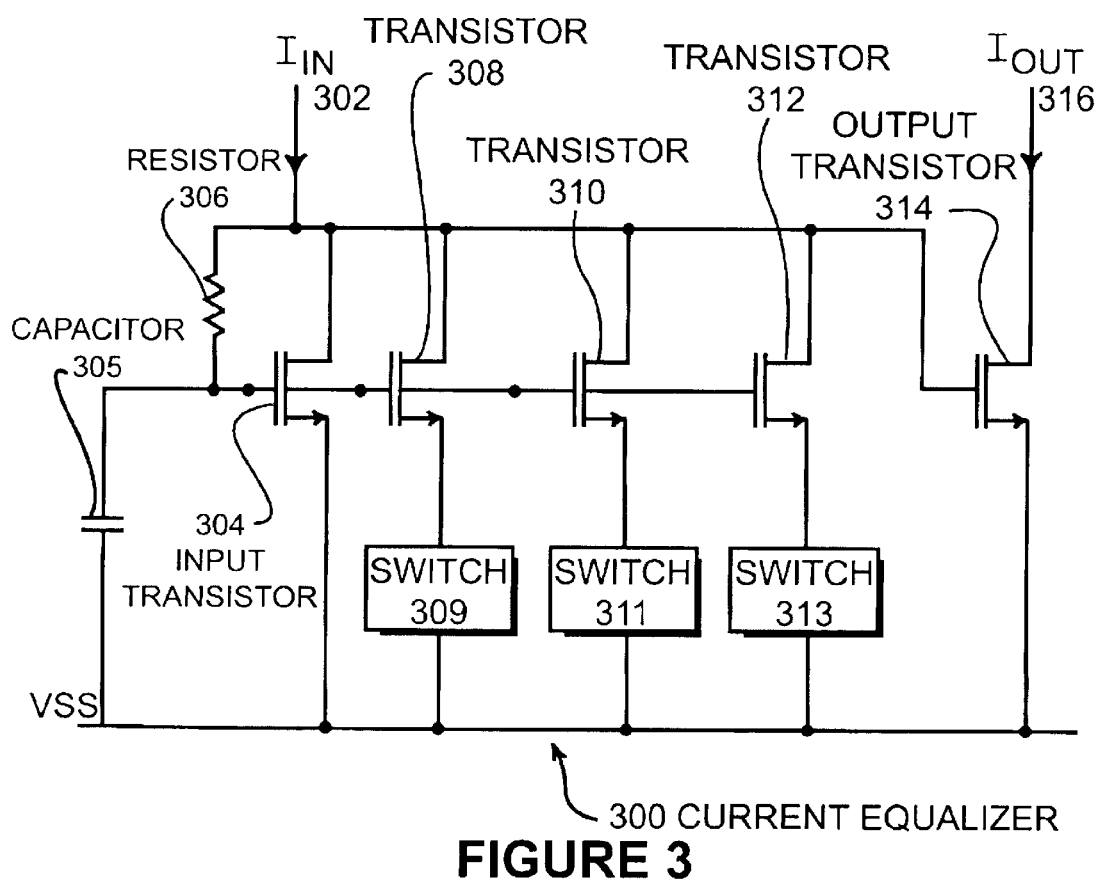
FIG. 3 is an illustration of a second embodiment of the present invention of a current equalizer wherein additional transistors are switched in and out of the circuit.

FIG. 3 illustrates a second embodiment 300 of the present invention of a current equalizer. The input line 302 is connected to the drain of input transistors 304, 308, 310, and 312. A resistor 306 and capacitor 305 are connected the gates of transistors 304, 308, 310, and 312. The resistor 306 is connected to the input 302 and the capacitor 305 is connected to VSS. The source of transistor 304 is connected to ground while the respective sources of transistors 308, 310, and 312 are connected to ground through the switches 309, 311, and 313. The input line 302 is connected to the gate of the output transistor 314. The drain of output transistor 314 is connected to the output line 316 and the source of output transistor 314 is connected to ground.

The switches 309, 311, and 313 allow the transistors 308, 310, and 312 to be individually switched into the circuit. In such a manner, the transfer function of the amplifier may be changed. In general, with the transistors removed from the circuit, the gain at lower frequencies will be higher than when the transistors are included in the circuit.

In some embodiments, the addition or removal of the transistors 308, 310, or 312 may cause the input current to be altered. In such embodiments, additional current drains may need to be switched into the circuit simultaneously with the transistors 308, 310, and 312. Several different means are available to those skilled in the arts for altering the input current when the transistors 308, 310, and 312 are switched into the circuit. Such means may be used by those skilled in the art while keeping within the spirit and intent of the present invention.

Figure 4:
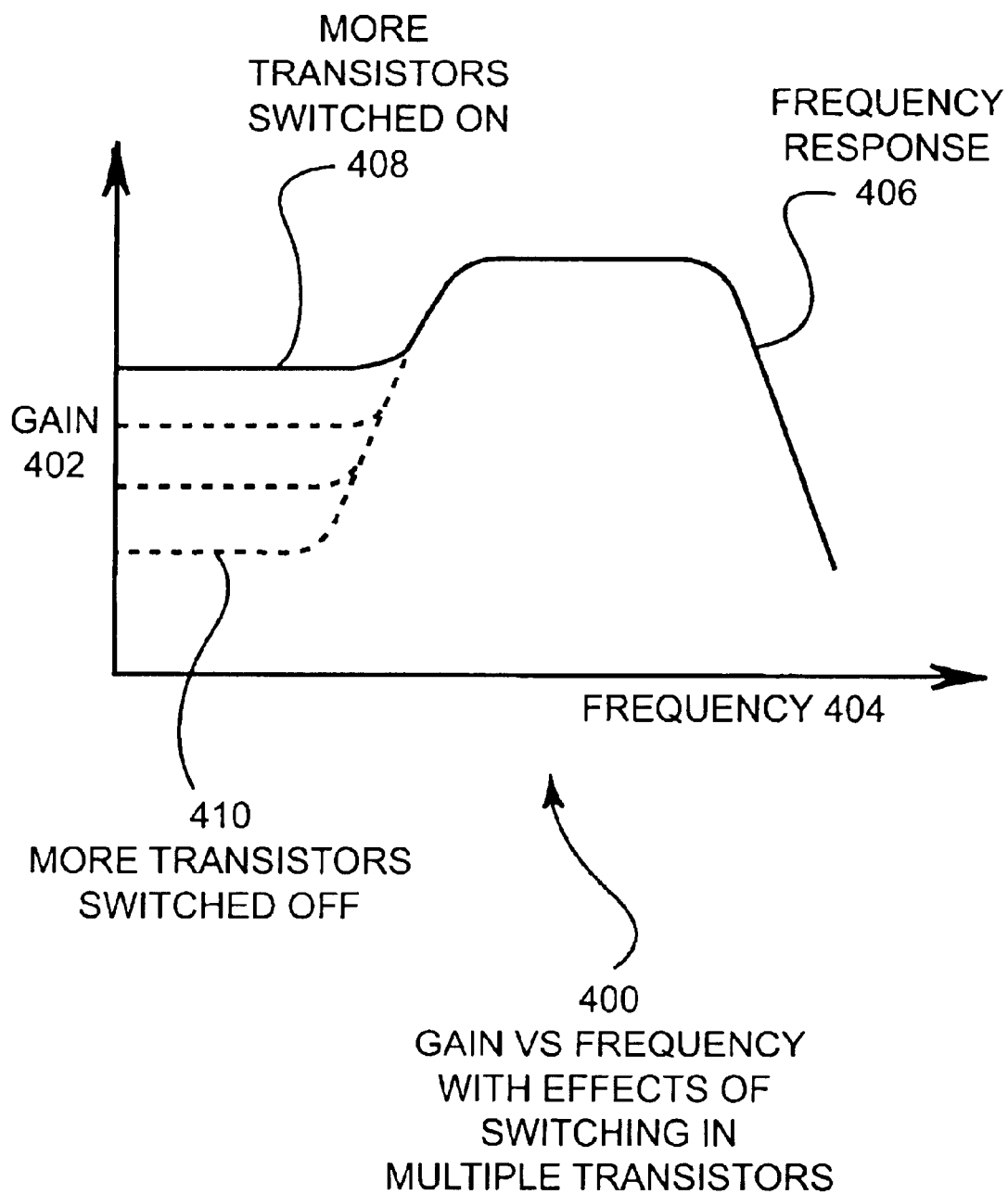
FIG. 4 is an illustration of a plot of the gain verses frequency of the embodiment illustrated in FIG. 3.

FIG. 4 illustrates a plot 400 of the gain 402 verses frequency 404 of the embodiment 300. The curve 406 represents the gain over a frequency spectrum. The shape of the curve 408 is representative of the case when more transistors are switched into the circuit. The shape of the curve 410 is representative of the case when more transistors are switched out of the circuit.

Figure 5:
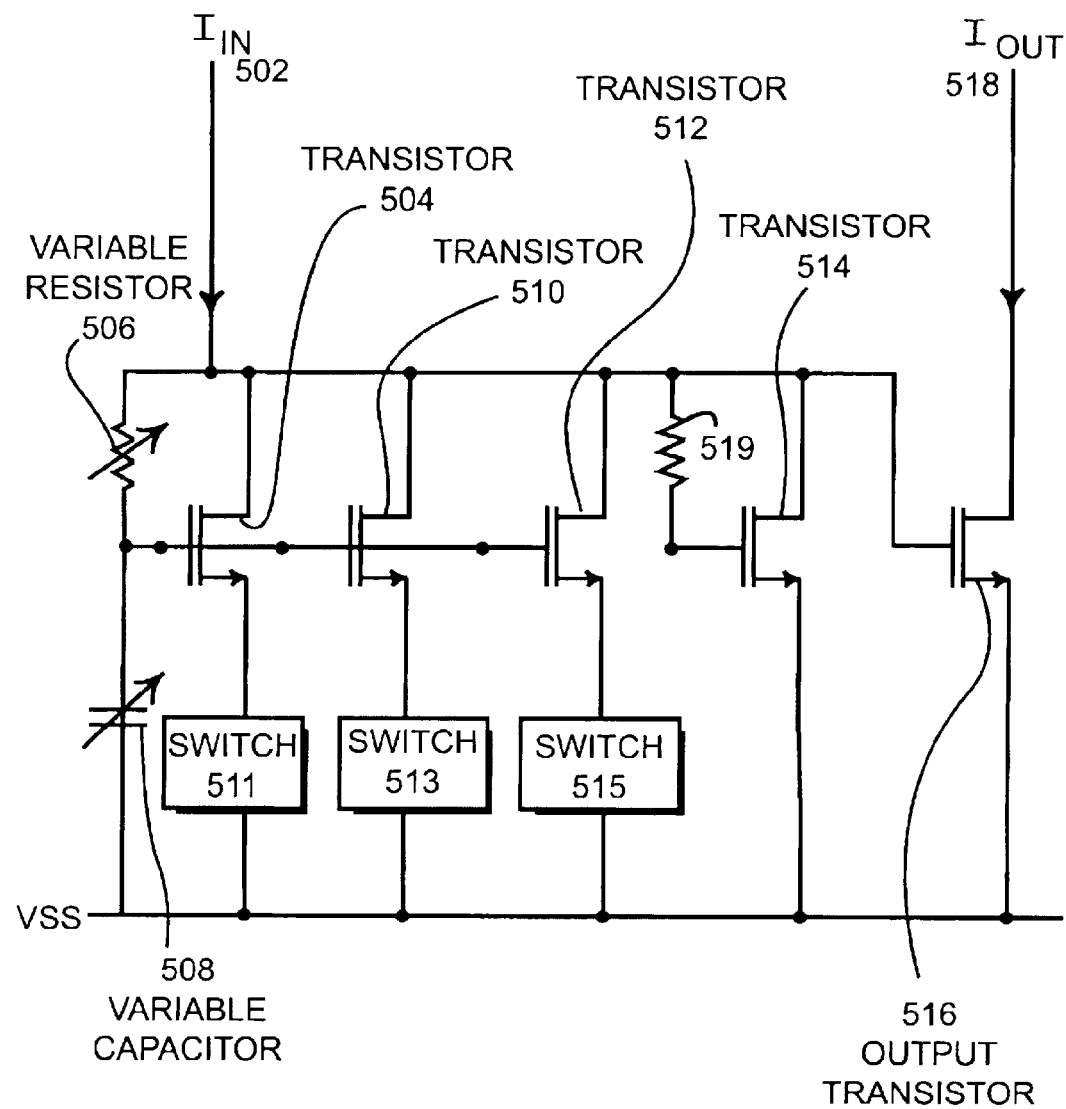
FIG. 5 is an illustration of a third embodiment of the present invention wherein variable resistance, variable capacitance, and several transistors are switchable into the circuit.

FIG. 5 illustrates a third embodiment 500 of the present invention wherein variable resistance, variable capacitance, and several transistors are switchable into the circuit. The input line 502 is connected to the drains of the transistors 504, 510, 512, and 514. A variable resistor 506 is connected from the input line 502 to the gates of the transistors 504, 510, and 512. A fixed resistor 519 is connected between the input line 502 and the gate of transistor 514. A variable capacitor 508 is connected from the gates of transistor 504 to ground. The source of transistor 508 is connected to ground. The sources of transistors 510, 512, and 514 are connected to ground through switches 511, 513, and 515. The input line 502 is connected to the gate of transistor 516. The output line 518 is connected to the drain of transistor 516 while the source of transistor 516 is connected to ground.

In some embodiments, the resistor 506 or capacitor 508 may be fixed components. For example, if the amplifier was being designed to amplify a specific signal and only one setting of the resistance is necessary, then a fixed resistor may be present. In this manner, the amplifier may be designed to operate without adjustment.

In other embodiments, additional switches may be connected between the drains of transistors 504 and 518 for balancing purposes. Such switches may not be activated but may only serve to balance the loading when switches 511, 513, or 515 are activated.

The embodiment 500 combines the variable resistor and capacitor of embodiment 100 with the switchable transistors of embodiment 300. The transfer function thereby has increased adjustability.

Figure 6:
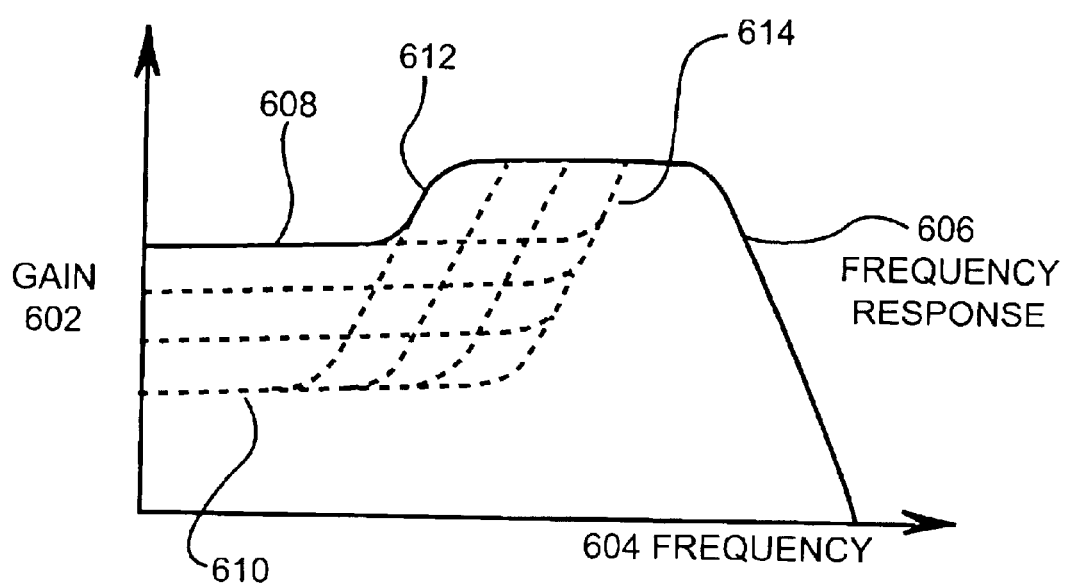
FIG. 6 illustrates a plot of the gain verses the frequency for the embodiment illustrated in FIG. 5.

FIG. 6 illustrates a plot 600 of the gain 602 verses the frequency 604. Curve 606 represents a typical gain verses frequency curve for the embodiment 500. The portion 608 of the curve represents a curve when many transistors are switched into the circuit. The portion 610 represents a curve when the switchable transistors are switched out of the circuit. The portion of the curve 612 represents a curve when high resistance and/or capacitance is present in the resistor 506 or capacitor 508. The portion of the curve 614 represents a curve when low resistance or capacitance is present in the resistor 506 or capacitor 508.

The plot 600 illustrates the effects of changing the variable factors of the equalizer 500. Both the low frequency gain and the transition point to the high frequency gain can be changed with the present embodiment. Those skilled in the arts will appreciate that various values of resistance, capacitance, and different transistors will result in various embodiments of the present invention while keeping within the spirit and intent of the present invention.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofor as limited by the prior art.

What is claimed is:

1. An equalizing current amplifier comprising:
   an input line;
   an output line;
   a first set of input transistors connected in parallel having the drains connected to said input line, the gates connected to said input line, and the sources connected to ground, said first set of input transistors comprising at least one transistor;
   a variable resistor connected to said input line and the gates of said first set of input transistors;
   a variable capacitor connected to the gates of said first set of input transistors and ground; and
   a first set of output transistors connected in parallel having the gates connected to said input line, the sources connected to ground, and the drains connected to said output line, said first set of output transistors comprising at least one transistor.

2. The equalizing current amplifier of claim 1 wherein said first set of input transistors and said first set of output transistors are N-type transistors.

3. The equalizing current amplifier of claim 1 wherein said amplifier is at least a portion of an integrated circuit.

4. The equalizing current amplifier of claim 1 wherein said first set of output transistors comprises a different number of transistors than said first set of input transistors.

5. The equalizing current amplifier of claim 1 wherein said variable capacitor comprises at least one capacitor that is capable of being switched into or out of the circuit between said ground and said gate of said first set of input transistors.

6. An equalizing current amplifier comprising:
   an input line;
   an output line;
   a first set of input transistors connected in parallel having the drains connected to said input line and the sources connected to ground, said first set of input transistors comprising at least one transistor;
   a resistor connected to said input line and the gates of said first set of input transistors;
   a second set of input transistors connected in parallel having the drains connected to said input line, the gates connected to said gates of said first set of input transistors, and the sources connected to a switch, said switch being connected to ground, said second set of input transistors comprising at least one transistor; and
   a first set of output transistors connected in parallel having the gates connected to said input line, the sources connected to ground, and the drains connected to said output line, said first set of output transistors comprising at least one transistor.

* * * * *